United States Patent [19]
Abbas et al.

[11] 4,062,040
[45] Dec. 6, 1977

[54] FIELD EFFECT TRANSISTOR STRUCTURE AND METHOD FOR MAKING SAME

[75] Inventors: Shakir Ahmed Abbas, Wappingers Falls; Robert Charles Dockerty, Highland, both of N.Y.

[73] Assignee: IBM Corporation, Armonk, N.Y.

[21] Appl. No.: 780,943

[22] Filed: Mar. 24, 1977

Related U.S. Application Data

[62] Division of Ser. No. 635,523, Nov. 26, 1975.

[51] Int. Cl.[2] .............................................. H01L 29/34
[52] U.S. Cl. ..................................... 357/54; 357/23; 357/52; 357/53; 357/59
[58] Field of Search ...................... 357/23, 52, 53, 54, 357/59; 204/192 R, 192 D

[56] References Cited
U.S. PATENT DOCUMENTS

| | | | |
|---|---|---|---|
| 3,793,090 | 2/1974 | Barile et al. | 357/23 |
| 3,841,926 | 10/1974 | Garnache et al. | 357/59 |
| 3,913,126 | 10/1975 | Hooker et al. | 357/54 |

*Primary Examiner*—Stanley D. Miller, Jr.
*Assistant Examiner*—Joseph E. Clawson, Jr.
*Attorney, Agent, or Firm*—Thomas F. Galvin

[57] ABSTRACT

An improved field effect transistor structure which reduces a leakage phenomenon, termed the "sidewalk" effect, between the semiconductor substrate and a conductive silicon dioxide layer disposed over the substrate. The improvement comprises forming a layer of highly resistive, silicon dioxide or silicon oxynitride, which is between the conductive oxide and the silicon nitride layer which forms a portion of the gate insulator for the field effect transistor.

2 Claims, 4 Drawing Figures

FIELD EFFECT TRANSISTOR STRUCTURE AND METHOD FOR MAKING SAME

This is a division, of application Ser. No. 635,523 filed Nov. 26, 1975.

BACKGROUND OF THE INVENTION

1. Field of the Invention

This invention relates to insulated gate field effect transistor devices. In particular, it relates to a method for reducing the charges induced in the dielectric layers which overlay the active regions of the field effect transistor.

2. Description of the Prior Art

In U.S. Pat. Nos. 3,811,076, in the name of William M. Smith, Jr., and 3,841,926, in the names of Garnache et al, which are assigned to the same assignee as the present invention, there is described an integrated circuit field effect transistor structure and method, respectively, which includes a capacitor acting as a storage element. From the standpoint of cost and performance, the storage element described therein fills a need for a large capacity memory with reasonable speed but which is very expensive to fabricate in highly dense form in a semiconductor substrate.

A key element of the memory cell described in the above-referenced patents is a conducting member disposed on an insulating layer above the semiconductor substrate. The electrode, preferably comprising polycrystalline silicon (polysilicon), is both a field relief electrode (field shield) as well as one of the electrodes of a capacitor. After the formation of this polysilicon electrode, an insulating layer of conductive silicon dioxide is also formed. The insulating layer is required because it electrically isolates the polysilicon layer from succeeding levels of metallization.

We have found, however, that a problem exists in the operation of the completed memory structure, which is due to the conductive silicon dioxide layer at the interface with the silicon nitride gate insulator and the presence of the polysilicon electrode. We use the term "conductive" silicon dioxide in a relative sense. Thus, at an oxide field of $4 \times 10^6$ v/cm, the conductivity of the silicon dioxide layer formed on the polycrystalline silicon layer is about one million times greater than the conductivity of silicon dioxide formed by thermal oxidation of single crystal silicon.

The problem occurs as follows:

When a positive bias is applied to either the polysilicon field shield or to the gate electrode, electrons are extracted from the silicon nitride into the silicon dioxide layer. When, during the operation of the device, the electrons are removed, a net positive charge remains at the interface between the silicon dioxide layer and the silicon nitride layer. This charge tends to invert that area of the silicon semiconductor substrate which is below the conductive silicon dioxide layer. This inversion causes an increase in what is termed subthreshold leakage, i.e., current which tends to flow within the device at below the nominal threshold voltage of the field effect transistor. This problem has become known as the "sidewalk" problem because the inversion of the silicon occurs below two parallel strips of conductive silicon dioxide. These strips, located between the source and drain electrodes of the FET, are not controlled by the gate electrode and cause parasitic leakage.

Attempts to reduce sidewalk leakage have been made both by increasing the temperature at which the polysilicon is oxidized from 925° C to 1075° C as well as by delaying the diborane flow during the initial stages of the in situ boron-doped polysilicon deposition process. These attempts have had some success in reducing sidewalk leakage. However, they have not been entirely satisfactory.

SUMMARY OF THE INVENTION

It is therefore an object of this invention to substantially eliminate the leakage problem in the type of field effect transistor described above.

This object and other objects are achieved by forming a high resistivity region between the interface of the condictive silicon dioxide layer and the silicon nitride layer. This layer blocks the electron transport between the interface and the conductive silicon dioxide layer.

We have found that the voltage protection obtained in a typical device has increased from around 4–8 volts in the prior art device to about 40 volts.

The high resistivity layer comprises either chemically vapor deposited silicon dioxide, sputtered silicon dioxide or silicon oxynitride.

DESCRIPTION OF THE PREFERRED EMBODIMENTS

Our preferred embodiments are essentially improvements in the fabrication of a prior art device which has already been described in the above-referenced U.S. Pat. Nos. 3,841,926 and 3,811,076. Thus, except for the inventive step of providing the highly resistive layer, the devices are fabricated by processes known to the art. It is deemed advisable, however, to describe the fabrication of the field effect transistor. This will clarify the invention and place it in context because it is applicable to structures other than those described in the above-referenced patents.

Figure 1:
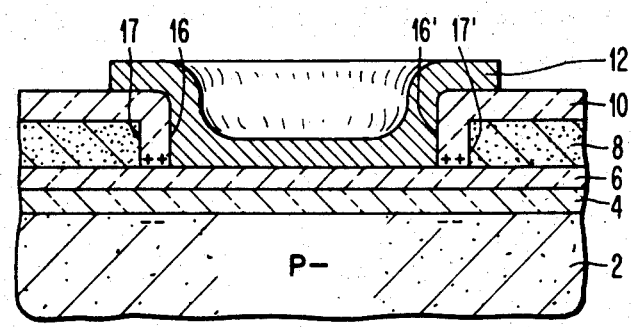
FIG. 1 is a cross-sectional view of a field effect transistor structure as fabricated prior to our invention.
Figure 2:
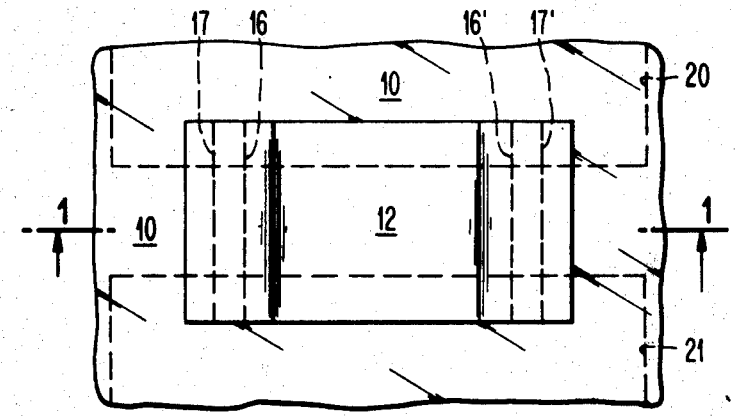
FIG. 2 is a plan view of the transistor for better illustrating the "sidewalks" of the transistor.

FIGS. 1 and 2 show a prior art N channel field effect transistor comprising a P-type silicon substrate 2 preferably oriented in the (100) crystallographic orientation and having a typical resistivity of about 2 ohms-cm. A composite dielectric insulating layer of silicon dioxide 4 and silicon nitride 6 is formed to provide the gate insulator. The thickness of silicon dioxide layer 4 is preferably around 380 angstroms; and silicon nitride layer 6 is around 200 angstroms. Layer 4 is preferably formed from the silicon substrate 2 by heating in dry oxygen at 970° C. The preferred range of thickness for the gate oxide is from 200 to 900 angstroms.

Silicon nitride layer 6 is preferably formed in a gaseous atmosphere of $SiH_4$ plus $NH_3$ in an $N_2$ carrier at 800° C. The preferred range of nitride layer 6 is between 100 to 350 angstroms.

Disposed on the surface of the composite gate dielectric are three layers: a polycrystalline silicon conductive electrode 8, a conductive silicon dioxide layer 10, and a gate electrode 12, which is preferably aluminum. As described in the above-referenced U.S. Pat. No. 3,811,076, polycrystalline electrode 8 serves the dual purpose of both a field shield as well as the electrode of a capacitor in regions which may be co-extensive with gate electrode.

Conductive silicon dioxide layer 10 surrounds both the upper surface as well as the sidewalls of electrode 8 and has a thickness of around 3,000 angstroms. It serves to insulate electrode 8 from the aluminum gate metallization 12. In regions where gate electrode 12 and layer 8 are co-extensive, a capacitor is formed with layer 10 comprising the dielectric.

The foregoing description forms no part of our invention per se. As previously mentioned, the device forms part of the prior art.

As described in the above-referenced U.S. Pat. No. 3,841,926 layer 10 is formed by the oxidation of layer 8. It has been found that during this process, the boron in the polysilicon remains within the region which is converted into $SiO_2$.

The high conductivity of oxide layer 10 is due both to the boron incorporated into the oxide as well as to surface irregularities of polysilicon layer 8. As shown in FIGS. 1 and 2, a positive charge tends to build up at the interface between conductive silicon dioxide layer 10 and silicon nitride layer 6. The charge is concentrated between sidewalls 16 and 17 of layer 10 and is shown for illustrative purposes by the symbols +++. The "sidewalk" configuration is apparent in the view of the structure in FIG. 2 where the problem region comprises a pair of rectangular strips.

Field effect transistor structures similar to the structure described in U.S. Pat. No. 3,811,076 can be fabricated with a phosphorus — or arsenic — doped polysilicon layer 8 instead of boron. In these structures, silicon dioxide layer 10 has high conductivity due to surface irregularities of polysilicon layer 8 only.

During the operation of the N channel field effect transistor as a memory device, a positive bias may be applied to conductive electrode 8 or, alternatively, to the aluminum gate electrode 12. The existence of a positive bias causes electrons to be extracted from the interface between silicon dioxide layer 10 and silicon nitride layer 6. It is well known in the art that charges are trapped at this interface.

The electrons so removed from the interface travel through conductive oxide 10 to whichever electrode 12 or 8 is biased. With the electrons so removed, a net positive charge remains at the interface. This net positive charge tends to invert the underlying silicon substrate as shown by the symbols — in FIG. 1. This inversion, in turn, causes an increase in subthreshold leakage. In practice, during the operation of the field effect transistor device the increase in leakage causes the device to turn on prematurely. Because the currect flow between the source 20 and drain 21 electrodes through the channel in an N channel device is negative, this undesirable increase in negative charges causes the device to turn on at a lower threshold than usual. This will also cause the charge stored in the node capacitor to leak and destroy the information stored. A similar phenomenon occurs in P channel field effect transistors with the application of negative biasis to the electrodes.

Figure 3:
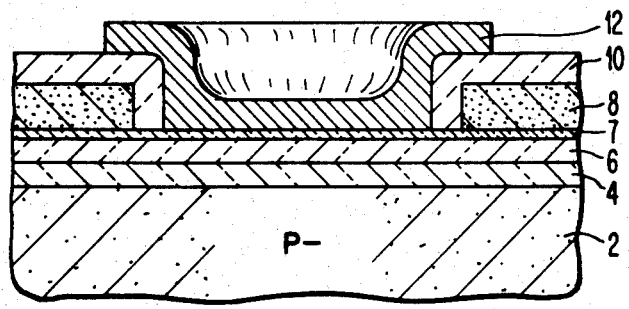
FIG. 3 is a cross-sectional view of a field effect transistor fabricated in accordance with one preferred embodiment of our invention.

As previously mentioned, our solution to the problem is to provide a highly resistive layer between the silicon nitride layer 6 and the conductive silicon dioxide layer 10. The highly resistive layer, denoted by the numeral 7 in FIG. 3, is selected from the group consisting of chemically vapor deposited silicon dioxide, sputtered silicon dioxide, or silicon oxynitride ($Si_x N_y O_z + SiO_2$). The layers are preferably very thin. For example, the chemically vapor deposited silicon dioxide is preferably around 100 angstroms in thickness. The silicon oxynitride is preferably formed by annealing silicon nitride layer 6 in an oxygen atmosphere for around one hour, thereby forming a thin layer of silicon oxynitride plus silicon dioxide.

The annealing of silicon nitride to form silicon oxynitride has been described previously in U.S. Pat. No. 3,793,090 in the names of Barile et al, and assigned to the same assignee as the present invention. In that patent it was revealed that annealing the nitride-oxide gate dielectric in oxygen at temperature ranges between 970° C to 1150° C substantially reduces the shift in threshold voltages which occur throughout the lifetime of a field effect transistor having a polysilicon gate electrode. At the time of filing the application which matured into U.S. Pat. No. 3,793,090 it was believed that the compound $Si_x N_y O_z$ alone was formed by the annealing process. It is understood now, however, that a mixture of $Si_x N_y O_z + SiO_2$ is actually formed. This distinction is relatively unimportant for practical purposes and the term silicon oxynitride is used in this specification to indicate $Si_x N_y O_z + SiO_2$.

In the present invention, the silicon oxynitride layer serves as a high resistivity layer between the conductive silicon dioxide region 10 and the silicon nitride layer 6 for the purpose of preventing charge inversion. The temperature range for the formation of the silicon oxynitride is not limited to 970° C – 1150° C when the gate electrode 12 is other than polysilicon. For example, if aluminum is the gate electrode, the annealing temperature is preferably between 970° C and 1200° C.

After the formation of highly resistive material 7, polysilicon layer 8 is formed, preferably by the decomposition of silane in the presence of a boron-containing gas such as diborane at a temperature of about 900° C. A window is then etched in polysilicon layer 8 in those areas where the gate electrode 12 is to be formed. Openings (not shown) are also formed in a layer 8 to allow contact to the source and drain regions of the field effect transistors. As previously mentioned, layer 8 might also be doped with arsenic or phosphorus rather than boron.

Insulating layer 10 is then formed to completely cover the upper surface and the sidewalls of layer 8. As discussed in the aforementioned U.S. Pat. No. 3,841,926, the layer 10 is formed by thermal growth from the layer 8 itself and about 30 percent of the polysilicon layer thickness is converted to oxide layer 10. A small amount of silicon dioxide also forms at this point on the surface of highly resistive material 7 if it is silicon oxynitride.

If highly resistive layer 7 is silicon dioxide, grown either by sputtering or chemical vapor deposition, so significant amount of silicon dioxide forms on its surface.

The process is completed by depositing gate electrode 12' which may comprise either aluminum or an alloy thereof such as aluminum-copper-silicon; polycrystalline silicon; or a composite of polycrystalline silicon and aluminum. The polycrystalline silicon-aluminum composite preferably comprises around one-half micron of polycrystalline silicon on which is disposed around one micron of aluminum.

Figure 4:
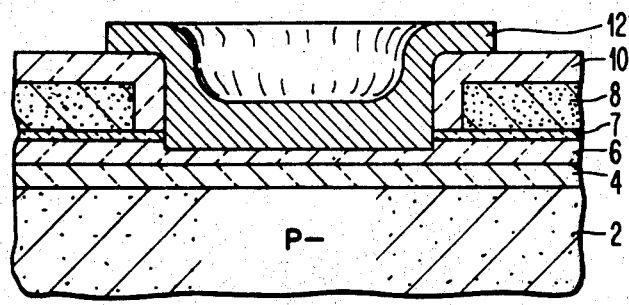
FIG. 4 is a cross-sectional view of a field effect transistor fabricated in accordance with yet another embodiment of our invention.

Turning now to FIG. 4, in the alternate embodiment the resistive material is etched away from the gate region of the field effect transistor and appears only in those locations where it is required, i.e., between the oxide 10 and silicon nitride layer 6. The etching step is preferably performed after the formation oxide layer 10 and before the deposition of the gate electrode 12'. The etchant is preferably buffered HF which is well known as one which will not attack silicon nitride rapidly. The etching step is carried on for a short period of time, e.g., 30 seconds, so as to remove completely layer 7 from the gate region while not significantly affecting oxide layer 10. This is possible because layer 10 is substantially thicker, around 3,000 angstroms, than the highly restrictive layer 7.

To summarize, our invention has solved the sidewalk problem which causes inversion in field effort transistors having a polycrystalline field shield. In actual devices fabricated with the highly resistive layer, inversion does not occur unless gate electrode is operated at around 40 volts, a potential which is never reached practice. In comparison, devices fabricated without the highly resistive layer tended to invert at potentials applied to the gate electrode of as little as 4-8 volts.

While the invention has been particularly shown and described with reference to preferred embodiments thereof, it will be understood by those skilled in the art that the foregoing and other changes in form and detail may be made without departing from the spirit and scope of the invention.

We claim:

1. In a field effect transistor which includes a composite silicon dioxide-silicon nitride insulating layer over the active regions thereof;
    a field shield electrode of polycrystalline silicon over a portion of said composite layer;
    a conductive silicon dioxide layer over the upper and sidewall surfaces of said field shield; and
    a gate electrode disposed over said composite layer and insulated from said field shield by said conductive silicon dioxide layer;
    the improvement comprising;
    a layer of highly resistive material disposed between said conductive silicon dioxide layer and said silicon nitride layer;
    said material selected from group consisting of silicon oxynitride and silicon dioxide.

2. A field effect transistor as in claim 1 wherein said highly resistive material is also disposed between said silicon nitride and said gate electrode.

* * * * *